US009521723B2

(12) United States Patent
Nebon et al.

(10) Patent No.: US 9,521,723 B2
(45) Date of Patent: Dec. 13, 2016

(54) INTEGRATED DEVICE COMPRISING A MATRIX OF OLED ACTIVE PIXELS WITH IMPROVED DYNAMIC RANGE

(71) Applicant: STMicroelectronics International N.V., Amsterdam (NL)

(72) Inventors: Jerome Nebon, Seyssins (FR); Christophe Forel, Grenoble (FR)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 14/723,942

(22) Filed: May 28, 2015

(65) Prior Publication Data

US 2015/0366026 A1 Dec. 17, 2015

(30) Foreign Application Priority Data

Jun. 11, 2014 (FR) ...................................... 14 55282

(51) Int. Cl.
*H01L 27/32* (2006.01)
*H05B 33/08* (2006.01)
*G09G 3/32* (2016.01)

(52) U.S. Cl.
CPC ........ *H05B 33/0896* (2013.01); *G09G 3/3233* (2013.01); *G09G 2300/0814* (2013.01); *G09G 2320/0247* (2013.01); *G09G 2320/045* (2013.01)

(58) Field of Classification Search
CPC ................ H05B 33/08; H05B 33/0896; G09G 2320/045; G09G 2300/0814; G09G 3/3233; G09G 2320/0247; H01L 27/32; H01L 27/3211; H01L 27/3244
USPC ....... 315/160, 169.3, 291; 345/76, 204, 212, 345/214, 690
See application file for complete search history.

(56) References Cited

U.S. PATENT DOCUMENTS

2004/0183758 A1 9/2004 Chen et al.
2012/0249516 A1* 10/2012 Wacyk ................ G09G 3/3233 345/212
2012/0313923 A1* 12/2012 Minami ............... G09G 3/3233 345/212
2013/0026929 A1* 1/2013 Kasai ..................... G09G 3/003 315/160

OTHER PUBLICATIONS

INPI Search Report and Written Opinion for FR 1455282 dated Jan. 20, 2015 (7 pages).

* cited by examiner

*Primary Examiner* — Thai Pham
(74) *Attorney, Agent, or Firm* — Gardere Wynne Sewell, LLP

(57) ABSTRACT

An integrated device includes a semiconducting substrate having a matrix of active pixels formed therein. Each active pixel includes an OLED diode, a first nMOS transistor having its source coupled to an anode of the OLED diode, and a refresh circuit coupled to a gate of the first nMOS transistor. The first nMOS transistor has its source and its substrate coupled together. The first nMOS transistor is situated in and on a first part of the semiconductor substrate, and the refresh circuit is situated in and on a second part of the semiconductor substrate, with the first part and the second part being electrically insulated from one another.

18 Claims, 6 Drawing Sheets

INTEGRATED DEVICE COMPRISING A MATRIX OF OLED ACTIVE PIXELS WITH IMPROVED DYNAMIC RANGE

RELATED APPLICATION

This application claims the benefit and priority of French Patent Application No. 1455282, file Jun. 11, 2014, titled INTEGRATED DEVICE COMPRISING AN OLED ACTIVE PIXEL MATRIX WITH IMPROVED DYNAMIC RANGE, the contents of which are hereby incorporated by reference in their entirety.

TECHNICAL FIELD

Embodiments described herein relate to devices equipped with matrices of active organic light emitting diode (OLED) pixels, and more precisely to circuits controlling the OLED diodes of these matrices of active OLED pixels.

BACKGROUND

Liquid Crystal On Silicon (LCOS) devices may be used within display systems mounted on a user's head, with which an image is projected in front of the user's field of vision. These devices make it possible to project images with a good luminance, but have a low contrast and a sizable energy consumption.

To improve the contrast and reduce the energy consumption, devices furnished with OLED diodes have been developed. Indeed, these diodes make it possible to obtain, for the applications mentioned hereinabove, high contrast, low energy consumption, and acceptable luminance.

The luminance of these OLED diodes may be limited, for example being lower than that of LCOS devices, which may have a desirable luminance value on the order of 5000 candela per square meter.

The luminance of an OLED-equipped device is related to the voltage variation (or voltage swing) that may be obtained across the terminals of the OLED diodes. By way of indication, an increase of 300 millivolts in voltage variation may correspond to an increase in brightness on the order of 1000 candela per square meter.

Further developments in OLED devices are therefore desired.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

According to one embodiment, there is a device furnished with a matrix of active OLED pixels exhibiting an improved voltage variation over the prior art.

According to one aspect, there is an integrated device including a semiconducting substrate and a matrix of active pixels. The matrix of active pixels includes, for each active pixel, an OLED diode and a control circuit. The control circuit includes a first nMOS transistor having its source terminal coupled to the anode of the OLED diode, and a refresh circuit for the pixel coupled to a gate of the first nMOS transistor.

According to a general characteristic of this aspect, the first nMOS transistor has its source and substrate coupled together. The first nMOS transistor is situated in and on a first part of the substrate, while the refresh circuit is situated in and on a second part of the substrate, with the first part and the second part being electrically insulated from one another.

The inventors have observed that by electrically insulating the substrate of the first transistor from the substrate of the refresh circuit, and by interconnecting the source and the substrate of this first nMOS transistor which provides current to the diode, an improvement in the voltage variation, such as 500 or 600 millivolts, may obtained. The gate to source voltage of the first nMOS transistor is thus decreased, thereby subsequently making it possible to improve the dynamic range at the terminals of the diode whose anode is coupled to the source of the first nMOS transistor.

The refresh circuit can include at least one nMOS transistor. The refresh circuit can also include an nMOS transistor and a pMOS transistor having their sources coupled together as well as their drains coupled together.

The use of an nMOS transistor and a pMOS transistor to form a breaker switch makes it possible to favor the passage of more sizable voltage variations to the first nMOS transistor. Indeed, the behavior of the nMOS transistor of the refresh circuit favors the low voltages (the high voltages being limited for this type of transistor), and the behavior of the pMOS transistor of the refresh circuit favors the high voltages (the low voltages being limited for this type of transistor). It is thus possible to increase the dynamic range by about 500 or 600 millivolts.

The pMOS transistor and the nMOS transistor of the refresh circuit can be formed in and on zones of the second substrate part which are electrically insulated with respect to one another. The substrate of the nMOS transistor of the refresh circuit can be configured to be coupled to a negative potential.

It is thus possible to limit the leakage across this transistor since the intrinsic diodes of these transistors may then have less effect. This reduces the phenomenon of flicker.

It should be noted that the isolation of the substrate of the first nMOS transistor and the coupling of its source to its substrate may cause a drop in the capacitance exhibited by this first transistor. This drop in capacitance may bring about flicker. Indeed, the voltage across the terminals of the diode decays more rapidly between two refreshes with a lower capacitance.

To reduce this flicker, the device can include a second nMOS transistor forming a capacitor between the refresh circuit and the first nMOS transistor. The second nMOS transistor can be situated in and on a third substrate part electrically insulated from the first substrate part and from the second substrate part. As a variant, the second transistor may be situated in and on the second substrate part, that is to say the part of the refresh circuit.

If the refresh circuit is furnished with an nMOS transistor and with a pMOS transistor, the second nMOS transistor can be situated in and on the zone of the second part of the substrate of the nMOS transistor of the refresh circuit.

In this variant, the substrate of the second nMOS transistor and that of the nMOS transistor of the refresh circuit have the same polarization. This polarization can be negative. This makes it possible to limit the area used by the pixels, since some substrate regions are common.

The first substrate part can be delimited by isolation trenches having an N type doping, and the pMOS transistor of the refresh circuit can be formed in and on a deep isolation trench. Stated otherwise, the zone of the third substrate part of the pMOS transistor of the refresh circuit coincides with a deep isolation trench. The use of area is thus limited since the isolation of the first part also defines a zone in which a transistor is formed.

The first substrate part can include a single transistor, in this instance the first nMOS transistor.

The matrix of pixels can include groups of three pixels having a red pixel, a green pixel, and a blue pixel, and in which the transistors associated with each pixel are disposed so as to form a rectangle within the substrate, with the three rectangles being adjacent and arranged so that they form a square.

This disposition is particularly advantageous with regard to the space occupied by the transistors which are insulated with respect to one another, thereby increasing the area used.

BRIEF DESCRIPTION OF THE DRAWINGS

Other advantages and characteristics will appear on studying the detailed description of modes of implementation and embodiments, taken by way of nonlimiting examples and illustrated by the appended drawings in which.

DETAILED DESCRIPTION

Figure 1:
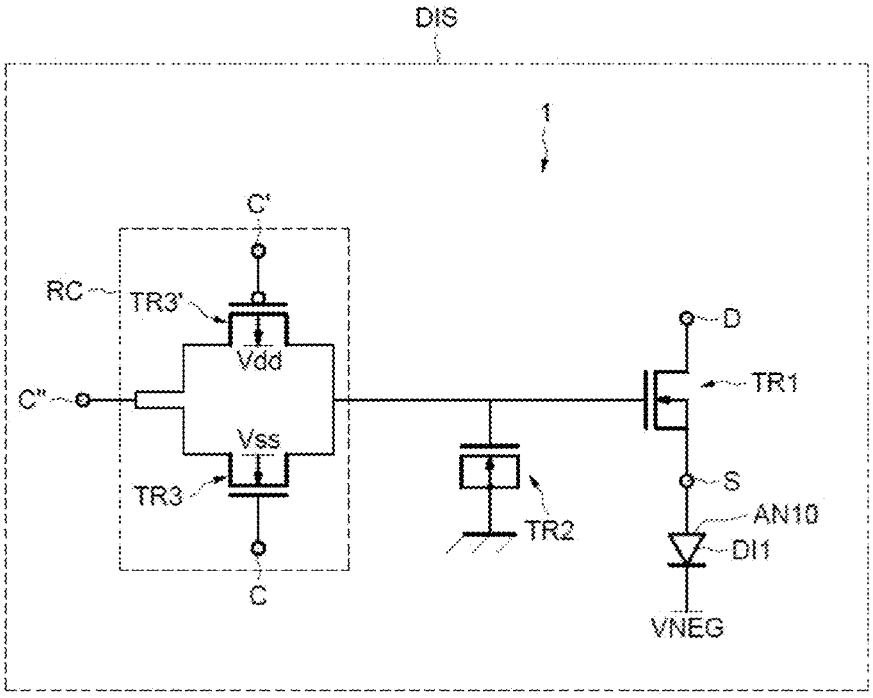
FIG. 1 is a schematic representation of a device according to one embodiment of this disclosure.

One or more embodiments of the present disclosure will be described below. These described embodiments are only examples of the presently disclosed techniques. Additionally, in an effort to provide a concise description, all features of an actual implementation may not be described in the specification.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Like reference numbers in the drawing figures refer to like elements throughout.

A device DIS comprising a circuit 1 intended to supply an OLED diode DI1 of an active pixel of a matrix of active pixels has been represented in a schematic manner in FIG. 1.

This circuit 1 comprises a first transistor TR1 of the nMOS type having its source S coupled to the anode AN10 of the OLED diode DI1. This transistor TR1 is arranged as a follower type setup, and makes it possible for the voltage applied to the gate of this transistor to be passed to its source. The drain D of this transistor is intended to be coupled to a power supply line. The cathode of the OLED diode DI1 is coupled to a negative potential VNEG.

The first nMOS transistor TR1 has its source and its substrate coupled together.

It may be noted that first nMOS transistor TR1 can have dimensions of the order of 0.5 micrometers for its gate length and of the order of 0.8 micrometers for its gate width.

The circuit of FIG. 1 also comprises a second nMOS transistor TR2 forming a capacitor between the gate of the first nMOS transistor TR1 which is coupled to a refresh circuit RC and a reference supply such as ground. The second nMOS transistor TR2 can make it possible to limit the appearance of the phenomenon of flicker. The drain, the source, and the substrate of this second nMOS transistor TR2 are all coupled to ground. The gate of the second nMOS transistor TR2 is linked to the gate of the first nMOS transistor TR1.

The second nMOS transistor TR2 makes it possible to maintain the voltage applied to the gate of the first nMOS transistor TR1 between two refreshes of the pixel.

The second nMOS transistor TR2 can have dimensions on the order of 2.87 micrometers for its gate length and on the order of 0.8 micrometers for its gate width to obtain a sufficient capacitance value.

The refresh circuit RC is coupled both to the gate of the first nMOS transistor TR1 and to the gate of the second nMOS transistor TR2.

Although it is possible to use a refresh circuit using a single transistor having its source linked to a pixel columns selection line, its gate linked to a pixel row selection line, and its drain to the gate of the first nMOS transistor TR1, it is particularly advantageous to use an nMOS transistor and a pMOS transistor coupled in parallel in order to increase the dynamic range.

The refresh circuit RC therefore comprises here an nMOS transistor TR3 and a pMOS transistor TR3', these two transistors have their sources coupled together and have their drains coupled together.

The gates of these transistors receive complementary signals, with the gate of the nMOS transistor TR3 being able to be coupled directly to a pixel row selection line by the terminal C, and the gate of the pMOS transistor TR3' being able to be coupled to a line traversed by a signal complementary to that of the pixel row selection line by the terminal C'. The common source of these two transistors is coupled to a pixel column selection line by the terminal C".

The substrate of the transistor TR3' is coupled to the power supply voltage VDD while the substrate of the transistor TR3 is coupled to a potential VSS. The nMOS transistor TR3 and the pMOS transistor TR3' of the refresh circuit have dimensions on the order of 0.8 micrometers for their gate length and on the order of 0.5 micrometers for their gate width.

It may be noted that in the example of FIG. 1, the substrates of the transistors TR1, TR2, TR3 and TR3' are coupled to different potentials, and are formed in substrate regions insulated from one another.

Figure 2:
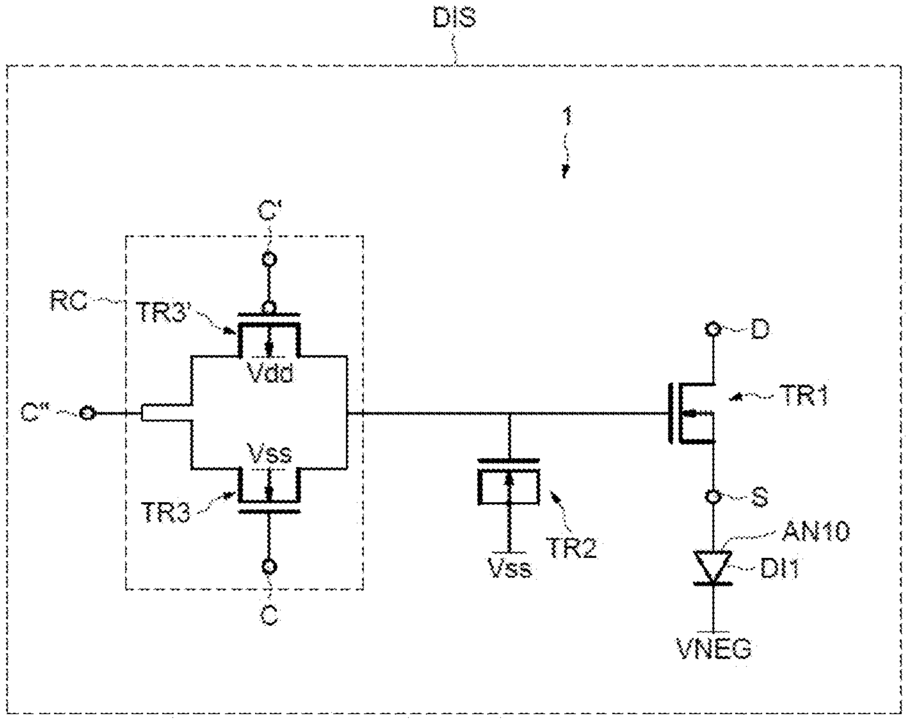
FIG. 2 is a schematic representation of a device according to another embodiment of this disclosure.

A variant in which the substrate, the drain, and the source of the transistor TR2 forming a capacitor are coupled to the same negative potential VSS as the substrate of the nMOS transistor TR3 of the refresh circuit RC has been represented in FIG. 2. The transistor TR2 and the transistor TR3 can thus be formed in and on the same substrate region.

Figure 3:
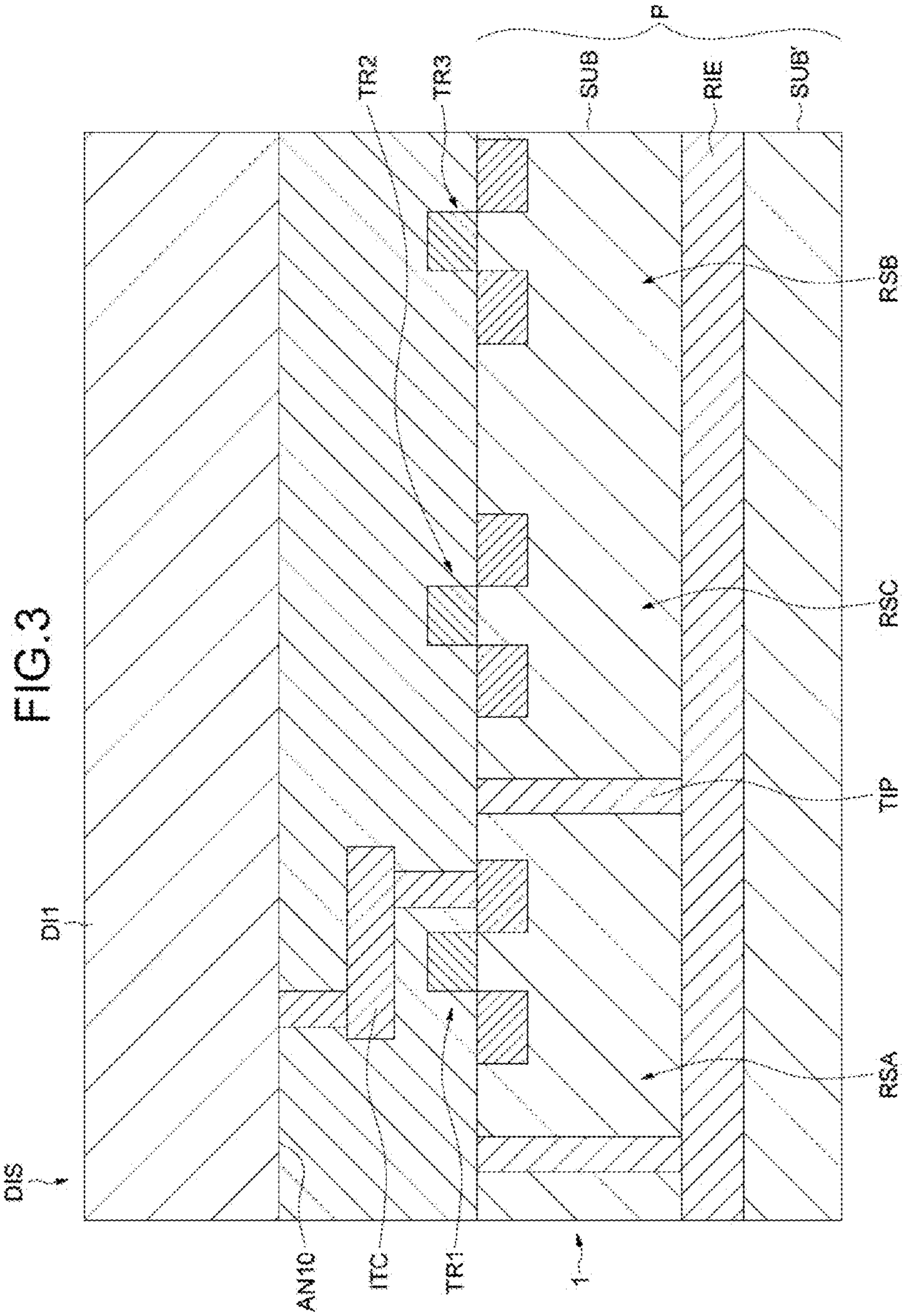
FIG. 3 is a sectional view of a portion of a device according to one embodiment of this disclosure.

FIG. 3 is a sectional partial view of a portion of a device DIS, for example that of FIG. 2. The device is produced here in and on a plate P which comprises a semi-conducting film forming the substrate SUB in which transistors are formed.

This film is disposed above a buried insulating region RIE, for example an N-doped region which makes it possible to insulate the P-doped substrate regions in which nMOS transistors are formed, and this buried insulating region RIE is itself disposed above a semi-conducting carrier substrate SUB'.

It may be noted that the term insulating region is understood to mean here a region whose conductivity is such that electrical insulation is obtained from the regions neighboring the insulating region, or else a region comprising an insulating material.

As a variant, the plate P can be replaced with a plate of silicon on insulator (SOI), which comprises a semi-conducting film forming a substrate, a buried oxide (BOX) insulating region, and a semi-conducting carrier substrate.

The first nMOS transistor TR1 is situated in and on a part RSA of the substrate SUB which is insulated from other parts of this substrate by means of lateral deep isolation trenches TIP which extend as far as the buried insulating region RIE so as to help ensure complete isolation of the substrate parts with respect to one another. The lateral deep isolation trenches can comprise N-doped semi-conducting material, or else a material such as silicon dioxide.

The part RSA comprises this first nMOS transistor TR1. The first transistor TR1 has its source coupled to the anode AN10 of the diode DI1 by metallic interconnections ITC.

The second nMOS transistor TR2, is formed in a part of the substrate RSC, which is also separated from the part RSA of the first nMOS transistor TR1 by deep isolation trenches TIP and by the buried insulating region RIE. The substrate part RSC of this second nMOS transistor TR2 can be coupled to a potential VSS of about −0.350 millivolts.

In FIG. 3, the transistor TR3 belonging to the refresh circuit is also represented, and this transistor is formed here in a part RSB of the substrate which is insulated from the RSA region of the first nMOS transistor TR1 but which is not insulated from the region RSC of the second nMOS transistor TR2. The regions RSC and RSB are common, and the second nMOS transistor TR2 is situated in and on the same substrate part as the refresh circuit. This makes it possible to limit the use of area within the plate P.

The substrate part RSB of the nMOS transistor TR3 of the refresh circuit and the substrate part RSC of the second nMOS transistor TR2 are coupled to a negative potential VSS, for example −0.350 millivolts, thereby decreasing the leakage through the nMOS transistor TR3.

Figure 4:
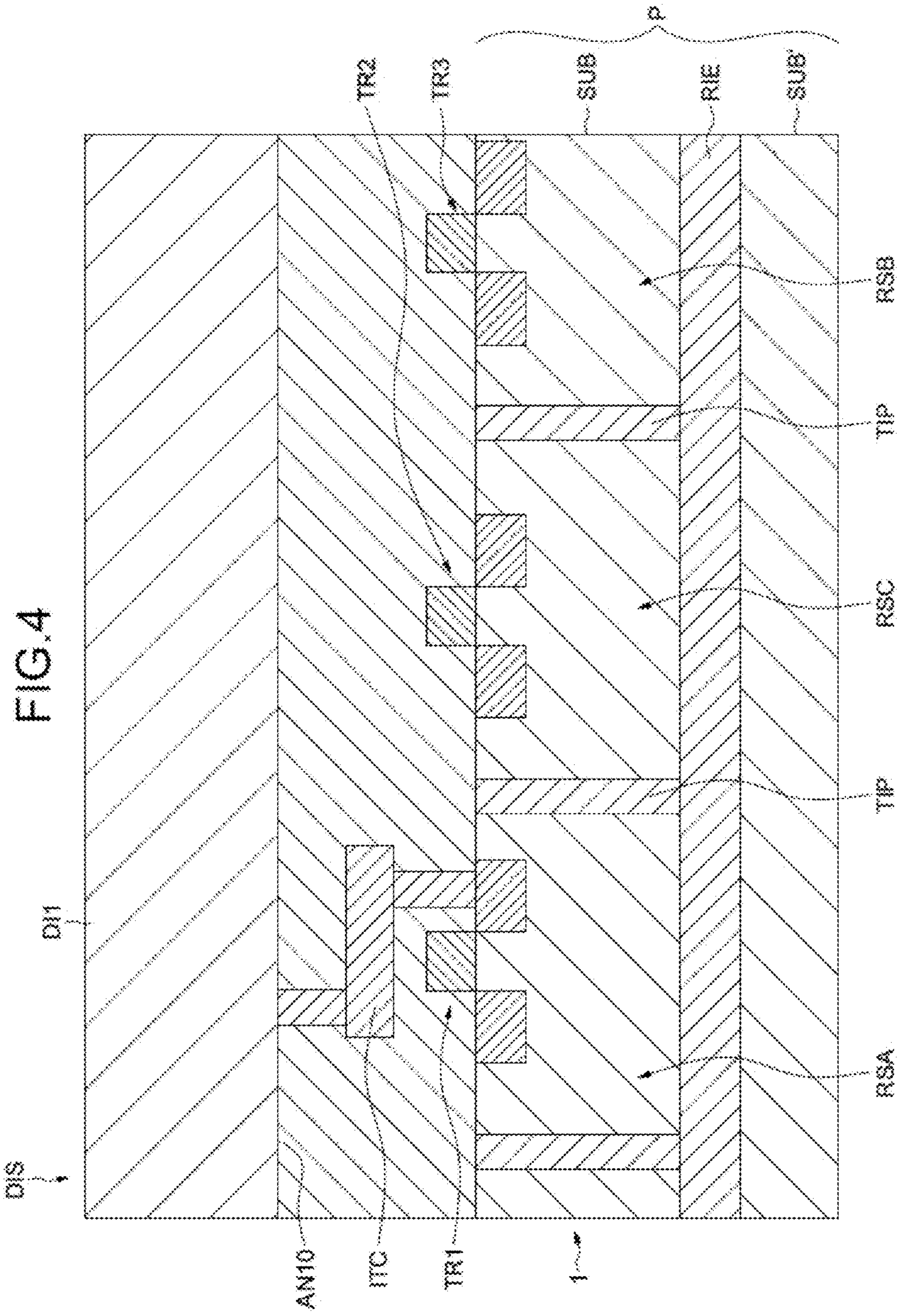
FIG. 4 is a sectional view of a portion of a device according to another embodiment of this disclosure.

FIG. 4 is also a sectional partial view of a device DIS, for example that of FIG. 1. In this variant, a deep isolation trench TIP is formed between the substrate part RSC of the second nMOS transistor TR2 and the substrate part of the nMOS transistor TR3 of the refresh circuit RSB. These two substrate parts RSC and RSB can thus be coupled to different potentials.

Figure 5:
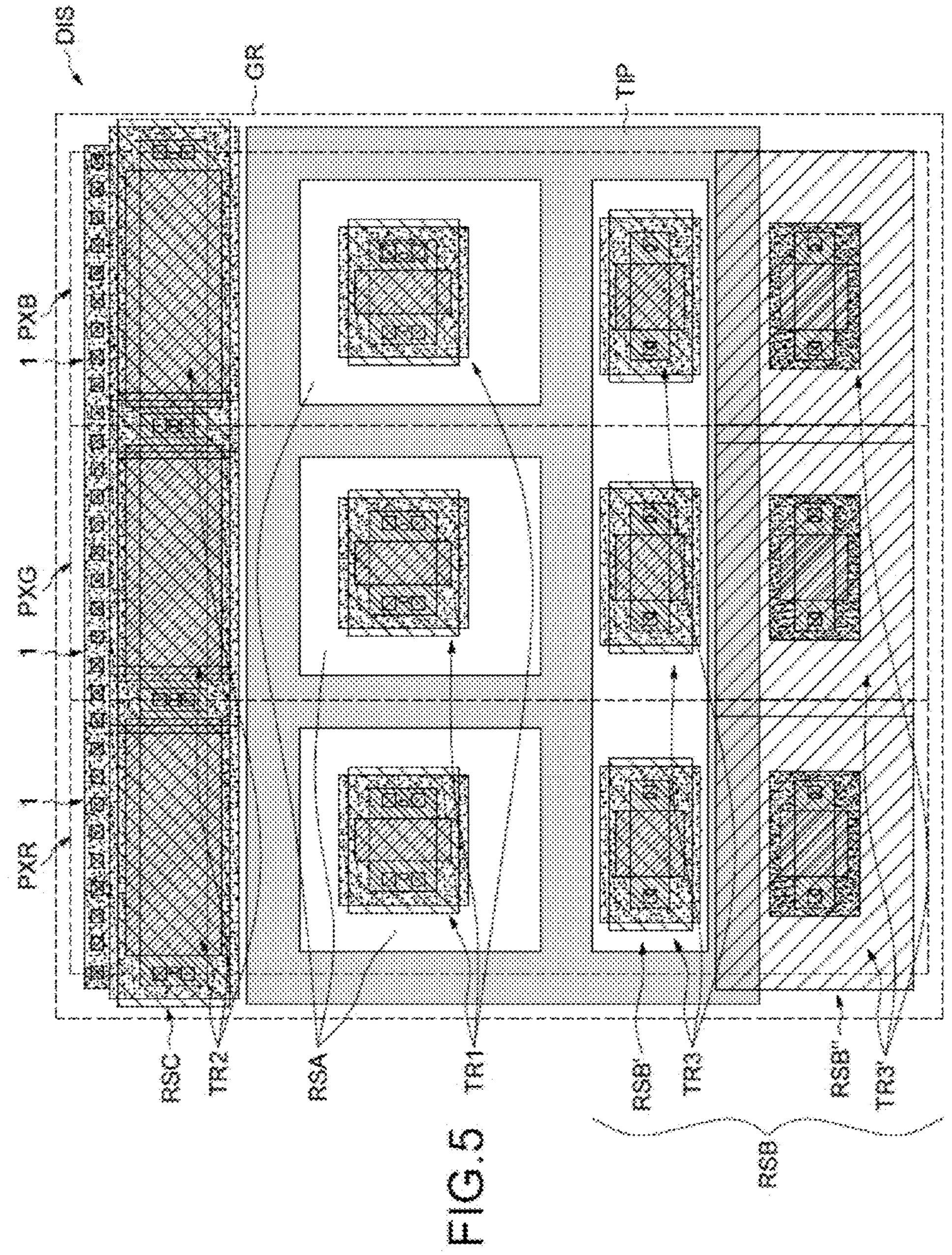
FIG. 5 is a schematic representation viewed from above of an arrangement of transistors according to one embodiment of this disclosure.

Viewed from above in FIG. 5 is the device DIS and the disposition of the transistors of the circuits 1 associated with three pixels of a group of red, green, and blue pixels, respectively designated in the figure by the references PXR, PXG and PXB. The device DIS of FIG. 5 corresponds to the devices of FIGS. 1 and 4.

The matrix of pixels comprises groups of three pixels, and a single group GR is represented in this FIG. 5. The pixel group GR comprises a red pixel PXR, a green pixel PXG, and a blue pixel PXB, and the transistors associated with each of these pixels are disposed so as to form a rectangle within the substrate delimited by the regions referenced PXi in the figure. The three rectangles of the pixels PXR, PXB and PXV are adjacent so that they form a square corresponding substantially in the figure to the delimitation of the group referenced GR.

These pixels PXR, PXB and PXV are surmounted by OLED diodes, as described by referring to FIG. 4. Each pixel comprises here a first nMOS transistor TR1 which is formed in a part RSA delimited by deep isolation trenches.

The transistors TR3 and TR3' of the refresh circuit are formed in the part of the substrate RSB which is insulated from the RSA parts of the first nMOS transistors TR1.

The part of the substrate RSB is furthermore separated into two mutually isolated zones RSB' and RSB" within which the transistors TR3 and TR3' of the refresh circuit are formed. The zone RSB', which comprises the nMOS transistors TR3, is isolated by means of shallow isolation trenches.

The zone RSB", which comprises the pMOS transistors TR3', has a conductivity of type N and it is insulated from the other parts.

The isolations between the parts and zones of the substrate RSA, RSC, RSB', and RSB" are obtained by the deep isolation trenches TIP and by the conductivity of the substrate of the pMOS transistors TR3' of the refresh circuit.

As may be seen in this FIG. 5, the first nMOS transistors TR1 of the pixels are formed in first substrate parts RSA which are insulated from the other transistors, and in particular from the other first transistors TR1. Stated otherwise, each substrate part RSA comprises one first nMOS transistor TR1.

Such is not the case for the second nMOS transistors TR2 which are formed here in the same substrate part RSC, therefore forming the transistors TR2 of the three pixels.

In the example of FIG. 5, the substrates of the transistors TR1, TR2, TR3 and TR3' can be respectively coupled to different potentials.

Figure 6:
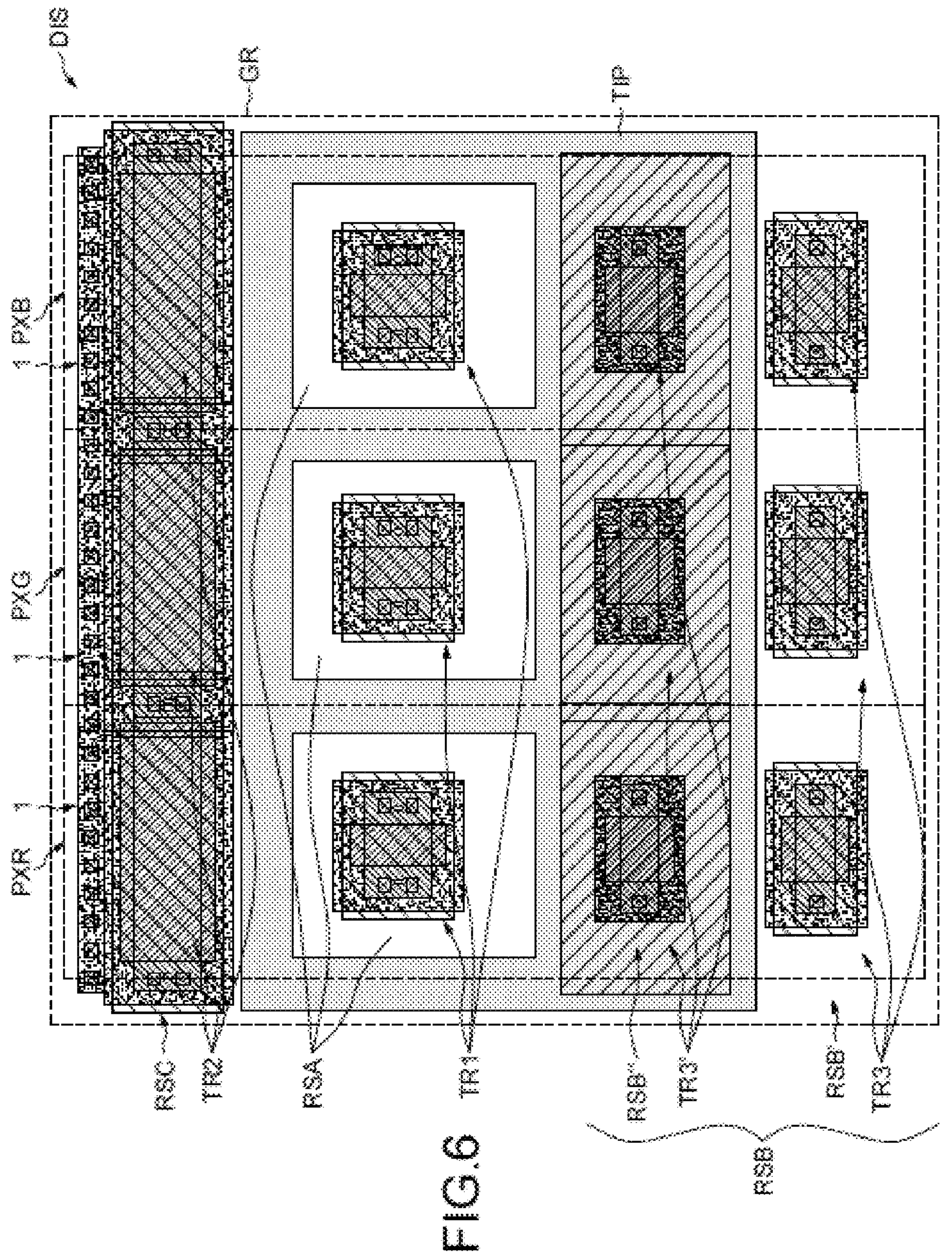
FIG. 6 is a schematic representation viewed from above of an arrangement of transistors according to another embodiment of this disclosure.

FIG. 6 is a view from above of a device DIS corresponding to the examples of FIGS. 2 and 3. In this example, the disposition of the transistors TR3 and TR3' of the refresh circuit is inverted with respect to the example of FIG. 5.

More precisely, the first nMOS transistor TR1 is disposed so as to be adjacent to the second nMOS transistor TR2 and to the pMOS transistor TR3' of the refresh circuit.

The nMOS transistor TR3 of the refresh circuit is disposed so as to be adjacent to the pMOS transistor TR3', and, when the matrix comprises several groups of pixels GR, the nMOS transistor TR3 has as a neighbour a second nMOS transistor TR2 of another group of pixels. Therefore, transistors of N type are situated at the level of the boundaries of the group of pixels at the top and at the bottom of the figure. A space saving for arranging groups of pixels alongside one another is thus obtained. It may be noted that the pMOS transistor TR3' is formed in the deep isolation trenches TIP which are here N-doped regions.

According to one aspect, the device described herein makes it possible to obtain increases in dynamic range of the order of two volts, doing so while limiting the occurrence of flicker if a second transistor is used to form a capacitor. Good luminance is thus obtained, allowing OLED-equipped devices to replace LCOS devices.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A device, comprising:
- a semiconductor substrate having first and second parts electrically insulated from one another; and
- a pixel formed in the semiconductor substrate and comprising:
  - an OLED diode, and
  - a control circuit comprising:
    - a first transistor formed in the first part of the semiconductor substrate and having a gate, a body, and a source, the source of the first transistor being coupled to the body of the first transistor and to the OLED diode, and
    - a refresh circuit comprising a second transistor formed in the second part of the semiconductor substrate and being coupled to the gate of the first transistor;
  - wherein the first transistor is an nMOS transistor and the second transistor is an nMOS transistor.

2. The device according to claim 1, wherein the second transistor of the refresh circuit has a source and a drain; and wherein the refresh circuit further comprises a third transistor having a source coupled to the source of the second transistor and a drain coupled to the drain of the second transistor, wherein the third transistor is a pMOS transistor.

3. The device according to claim 2, wherein the second and third transistors are formed in zones of the second part of the semiconductor substrate which are electrically insulated from one another.

4. The device according to claim 2, wherein the second transistor has a body coupled to a negative potential.

5. A device, comprising:
- a semiconductor substrate having first and second parts electrically insulated from one another; and
- a matrix of active pixels formed in the semiconductor substrate and comprising, for each active pixel:
  - an OLED diode having an anode, and
  - a control circuit comprising:
    - a first nMOS transistor having a gate, a body, and a source, the source of the first transistor being coupled to body of the first transistor and to the anode of the OLED diode, and
    - a refresh circuit comprising a second nMOS transistor coupled to control the gate of the first nMOS transistor;
  - wherein the first nMOS transistor is formed in the first part of the semiconductor substrate;
  - wherein the refresh circuit is formed in the second part of the semiconductor substrate.

6. The device according to claim 5, wherein the second nMOS transistor has a source and a drain, and further comprising a pMOS transistor having a source coupled to the source of the second nMOS transistor and a drain coupled to the drain of the second nMOS transistor.

7. The device according to claim 6, wherein the pMOS transistor and the second nMOS transistor of the refresh circuit are formed in zones of the second part of the semiconductor substrate which are electrically insulated from one another.

8. The device according to claim 6, wherein the second nMOS transistor of the refresh circuit has a body coupled to a negative potential.

9. The device according to claim 5, further comprising a third nMOS transistor forming a capacitor coupled between the refresh circuit and the first nMOS transistor.

10. The device according to claim 9, wherein the third nMOS transistor is formed in a third part of the semiconductor substrate electrically insulated from the first and second parts of the semiconductor substrate.

11. The device according to claim 9, wherein the third nMOS transistor is formed in the second part of the semiconductor substrate.

12. The device according to claim 7, wherein the third nMOS transistor is formed in a zone of the second part of the semiconductor substrate.

13. The device according to claim 12, wherein the first part of the semiconductor substrate is delimited by isolation trenches having an N-type doping, and wherein the pMOS transistor of the refresh circuit is formed in a deep isolation trench.

14. The device according claim 5, wherein the first nMOS transistor is a sole transistor in the first part of the semiconductor substrate.

15. The device according to claim 5, wherein the matrix of active pixels comprises groups of three pixels, each group of three pixels comprising a red pixel, a green pixel, and a blue pixel; and wherein the first nMOS transistors for each of the red pixel, green pixel, and blue pixel are disposed so as to form first, second, and third rectangles within the semiconductor substrate, with the first, second, and third rectangles being arranged so as to form a square.

16. A device, comprising:
- a semiconductor substrate having first and second parts electrically insulated from one another; and
- a matrix of active pixels formed in the semiconductor substrate and comprising, for each active pixel:
  - an OLED diode having an anode, and
  - a control circuit comprising:
    - a first nMOS transistor formed in the first part of the semiconductor substrate and having a gate, a body, and a source, the source of the first nMOS transistor being coupled to body of the first nMOS transistor and to the anode of the OLED diode, and
    - a refresh circuit formed in the second part of the semiconductor substrate and being coupled to the gate of the first nMOS transistor, the refresh circuit comprising:
      - a second nMOS transistor having a gate, a body, a source, and a drain, with the gate of the second nMOS transistor being coupled to a pixel row selection line, and the body of the second nMOS transistor being coupled to a first supply voltage, and
      - a pMOS transistor having a gate, a body, a source, and a drain, with the gate of the pMOS transistor being coupled to a complement of the pixel row selection line, and the body of the pMOS transistor being coupled to a second supply voltage,
    - wherein the source and drain of the second nMOS transistor are coupled respectively to the source and drain of the pMOS transistor.

17. The device according to claim 16, wherein the pMOS transistor and the second nMOS transistor of the refresh circuit are formed in zones of the second part of the semiconductor substrate which are electrically insulated from one another.

18. The device according to claim 16, further comprising a third nMOS transistor forming a capacitor coupled between the refresh circuit and the first nMOS transistor.

* * * * *